United States Patent
Harada et al.

(10) Patent No.: US 10,008,571 B2
(45) Date of Patent: Jun. 26, 2018

(54) SEMICONDUCTOR WAFER, SEMICONDUCTOR DEVICE, AND METHOD FOR MANUFACTURING NITRIDE SEMICONDUCTOR LAYER

(71) Applicant: ALPAD CORPORATION, Chiyoda-ku (JP)

(72) Inventors: Yoshiyuki Harada, Tokyo (JP); Toshiki Hikosaka, Kanagawa-ken (JP); Hisashi Yoshida, Kanagawa-ken (JP); Hung Hung, Kanagawa-ken (JP); Naoharu Sugiyama, Kanagawa-ken (JP); Shinya Nunoue, Chiba-ken (JP)

(73) Assignee: ALPAD CORPORATION, Chiyoda-ku (JP)

( * ) Notice: Subject to any disclaimer, the term of this patent is extended or adjusted under 35 U.S.C. 154(b) by 0 days. days.

(21) Appl. No.: 14/921,412

(22) Filed: Oct. 23, 2015

(65) Prior Publication Data

US 2016/0043183 A1 Feb. 11, 2016

Related U.S. Application Data

(62) Division of application No. 13/868,275, filed on Apr. 23, 2013, now Pat. No. 9,202,873.

(30) Foreign Application Priority Data

Sep. 21, 2012 (JP) .................. 2012-208567

(51) Int. Cl.
*H01L 21/02* (2006.01)
*H01L 29/66* (2006.01)
(Continued)

(52) U.S. Cl.
CPC ...... *H01L 29/2003* (2013.01); *H01L 21/0254* (2013.01); *H01L 21/02458* (2013.01);
(Continued)

(58) Field of Classification Search
CPC .. H01L 33/075; H01L 33/12; H01L 21/02458
(Continued)

(56) References Cited

U.S. PATENT DOCUMENTS 7,825,432 B2 11/2010 Saxler et al.
8,362,503 B2 1/2013 Saxler et al.
(Continued)

FOREIGN PATENT DOCUMENTS

CN 101847577 A 9/2010
JP 2002-151415 5/2002
(Continued)

OTHER PUBLICATIONS

Office Action dated Apr. 4, 2016 in Japanese Patent Application No. 2013-153000 (with English language translation).
(Continued)

*Primary Examiner* — Robert Huber
(74) *Attorney, Agent, or Firm* — Oblon, McClelland, Maier & Neustadt, L.L.P.

(57) ABSTRACT

According to one embodiment, a semiconductor wafer includes a substrate, an AlN buffer layer, a foundation layer, a first high Ga composition layer, a high Al composition layer, a low Al composition layer, an intermediate unit and a second high Ga composition layer. The first layer is provided on the foundation layer. The high Al composition layer is provided on the first layer. The low Al composition layer is provided on the high Al composition layer. The intermediate unit is provided on the low Al composition layer. The second layer is provided on the intermediate unit. The first layer has a first tensile strain and the second layer has a second tensile strain larger than the first tensile strain. Alternatively, the first layer has a first compressive strain and the second layer has a second compressive strain smaller than the first compressive strain.

16 Claims, 9 Drawing Sheets

(51) Int. Cl.
*H01L 29/20* (2006.01)
*H01L 33/12* (2010.01)
*H01L 33/00* (2010.01)
*H01L 29/06* (2006.01)
*H01L 29/205* (2006.01)
*H01L 29/36* (2006.01)
*H01L 33/06* (2010.01)
*H01L 33/32* (2010.01)
*H01S 5/343* (2006.01)

(52) U.S. Cl.
CPC .. *H01L 21/02505* (2013.01); *H01L 21/02617* (2013.01); *H01L 29/0684* (2013.01); *H01L 29/205* (2013.01); *H01L 29/36* (2013.01); *H01L 33/0075* (2013.01); *H01L 33/06* (2013.01); *H01L 33/12* (2013.01); *H01L 33/32* (2013.01); *H01S 5/34333* (2013.01)

(58) Field of Classification Search
USPC .. 257/183, 190, E33.034, E29.188, E29.246
See application file for complete search history.

(56) References Cited

U.S. PATENT DOCUMENTS

| | | | |
|---|---|---|---|
| 8,680,537 B2 | 3/2014 | Hikosaka et al. | |
| 2010/0248455 A1 | 9/2010 | Okuno | |
| 2012/0223328 A1 | 9/2012 | Ikuta et al. | |
| 2012/0292593 A1 | 11/2012 | Shioda et al. | |
| 2013/0062612 A1 | 3/2013 | Shioda et al. | |
| 2013/0065342 A1 | 3/2013 | Stauss et al. | |
| 2013/0087760 A1 | 4/2013 | Yoshida et al. | |
| 2013/0087762 A1 | 4/2013 | Hung et al. | |
| 2013/0099141 A1* | 4/2013 | Chua | H01L 33/06 250/504 R |
| 2013/0234151 A1 | 9/2013 | Hikosaka et al. | |
| 2013/0237036 A1 | 9/2013 | Hikosaka et al. | |
| 2014/0329350 A1 | 11/2014 | Stauss et al. | |

FOREIGN PATENT DOCUMENTS

| | | |
|---|---|---|
| JP | 2010-521064 | 6/2010 |
| JP | 2010-521065 | 6/2010 |
| JP | 2011-119715 A1 | 6/2011 |
| JP | 2012-15306 | 1/2012 |
| JP | 2012-99539 | 5/2012 |
| JP | 2012099539 A * | 5/2012 |
| JP | 2013-187427 | 9/2013 |
| WO | WO 2011/039181 A1 | 4/2011 |

OTHER PUBLICATIONS

Combined Office Action and Search Report dated Oct. 29, 2015 in Chinese Patent Application No. 201310206392.2 (with English translation of category of cited documents).

Japanese Office Action dated May 27, 2013, in Japan Patent Application No. 2012-208567 (with English translation).

* cited by examiner

SEMICONDUCTOR WAFER, SEMICONDUCTOR DEVICE, AND METHOD FOR MANUFACTURING NITRIDE SEMICONDUCTOR LAYER

CROSS-REFERENCE TO RELATED APPLICATIONS

This application is division of U.S. Ser. No. 13/868,275, filed Apr. 23, 2013, which is based upon and claims the benefit of priority from the prior Japanese Patent Application No. 2012-208567, filed on Sep. 21, 2012; the entire contents of which are incorporated herein by reference.

FIELD

Embodiments described herein relate generally to a semiconductor wafer, a semiconductor device, and a method for manufacturing a nitride semiconductor layer.

BACKGROUND

When forming a component on a substrate made of a nitride semiconductor layer and a material that is different from the nitride semiconductor, defects such as dislocations, etc., occur easily in the nitride semiconductor layer due to different lattice constants and coefficients of thermal expansion. Technology for making a high-quality crystal having a low dislocation density is desirable when forming the nitride semiconductor layer.

DETAILED DESCRIPTION

Figures 1A, 1B:
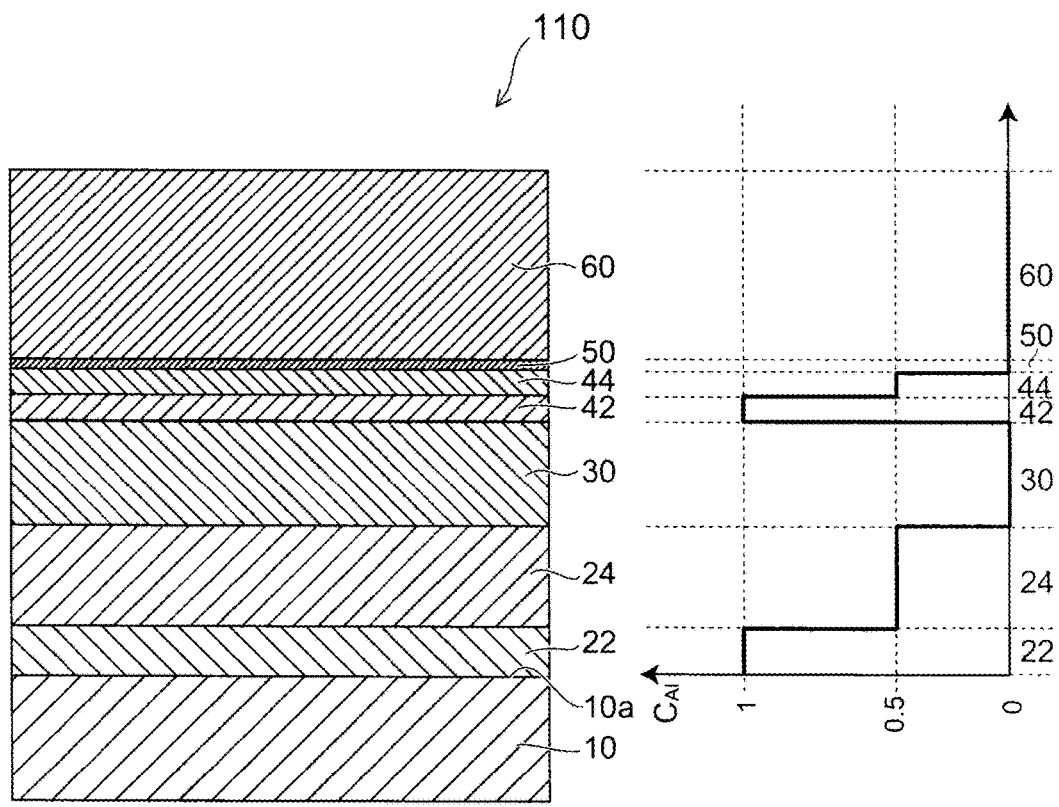
FIG. 1A and FIG. 1B are schematic views showing a semiconductor wafer according to a first embodiment.

According to one embodiment, a semiconductor wafer includes a substrate, an AlN buffer layer, a foundation layer, a first high Ga composition layer, a high Al composition layer, a low Al composition layer, an intermediate unit and a second high Ga composition layer. The substrate has a major surface. The AlN buffer layer of AlN is provided on the major surface. The foundation layer is provided on the AlN buffer layer, and includes a nitride semiconductor including Al and Ga. The first high Ga composition layer is provided on the foundation layer, and includes the nitride semiconductor including Ga. The high Al composition layer is provided on the first high Ga composition layer, and includes the nitride semiconductor including Al. A Ga composition ratio of the high Al composition layer is lower than a Ga composition ratio of the first high Ga composition layer. The low Al composition layer is provided on the high Al composition layer, and includes the nitride semiconductor including Al and Ga. A Ga composition ratio of the low Al composition layer is lower than the Ga composition ratio of the first high Ga composition layer. An Al composition ratio of the low Al composition layer is lower than an Al composition ratio of the high Al composition layer. The intermediate unit is provided on the low Al composition layer. A concentration of an impurity of one selected from Si, Mg, and B of the intermediate unit is higher than a concentration of the impurity of the high Al composition layer and a concentration of the impurity of the low Al composition layer. The second high Ga composition layer is provided on the intermediate unit, and includes the nitride semiconductor including Ga. A Ga composition ratio of the second high Ga composition layer being higher than the Ga composition ratio of the low Al composition layer. The first high Ga composition layer has a first tensile strain and the second high Ga composition layer has a second tensile strain larger than the first tensile strain. Alternatively, the first high Ga composition layer has a first compressive strain and the second high Ga composition layer has a second compressive strain smaller than the first compressive strain.

Various embodiments will be described hereinafter with reference to the accompanying drawings.

The drawings are schematic or conceptual; and the relationships between the thicknesses and the widths of portions, the proportions of sizes between portions, etc., are not necessarily the same as the actual values thereof. Further, the dimensions and/or the proportions may be illustrated differently between the drawings, even for identical portions.

In the drawings and the specification of the application, components similar to those described in regard to a drawing thereinabove are marked with like reference numerals, and a detailed description is omitted as appropriate.

First Embodiment

FIG. 1A and FIG. 1B are schematic views showing a semiconductor wafer according to a first embodiment.

FIG. 1A is a schematic cross-sectional view showing the semiconductor wafer 110 of the embodiment. FIG. 1B is a graph showing an Al composition ratio ($C_{Al}$) of the semiconductor wafer 110.

As shown in FIG. 1A and FIG. 1B, the semiconductor wafer 110 according to the embodiment includes a substrate 10, an AlN buffer layer 22, a foundation layer 24, a first high Ga composition layer 30, a high Al composition layer 42, a low Al composition layer 44, an intermediate unit 50, and a second high Ga composition layer 60.

Herein, an axis perpendicular to a first surface 10a of the substrate 10 is taken as a Z axis. One axis perpendicular to the Z axis is taken as an X-axis direction. A direction perpendicular to the Z axis and the X axis is taken as a Y axis. In the specification of the application, "stacking" includes not only the case of being overlaid in contact with each other but also the case of being overlaid with another layer inserted therebetween. Also, being "provided on" includes not only the case of being provided in direct contact but also the case of being provided with another layer inserted therebetween. The "inner-plane direction" is the XY planar direction.

The coefficient of thermal expansion of the substrate 10 is smaller than the coefficient of thermal expansion of the nitride semiconductor.

The substrate 10 is, for example, one selected from a silicon (Si) substrate, a silicon carbide (SiC) substrate, a zinc oxide (ZnO) substrate, a gallium phosphide (GaP) substrate, and an indium phosphide (InP) substrate. The coefficient of thermal expansion of the substrate 10 may be the same as the coefficient of thermal expansion of nitride semiconductor or larger. For example, the substrate 10 may be sapphire, gallium arsenide (GaAs).

The substrate 10 may include, for example, a Si substrate. The substrate 10 is, for example, a Si (111) substrate. However, in the embodiment, the plane orientation of the substrate 10 may not be the (111) plane and may be, for example, a plane orientation represented by (11n) (n being an integer) or the (100) plane. It is favorable to use the substrate of the (110) plane because, for example, the lattice mismatch between the silicon substrate and the nitride semiconductor layer decreases.

A substrate including an oxide layer may be used as the substrate 10. For example, an SOI (silicon on insulator) substrate may be used as the substrate 10.

Hereinbelow, the c axis of the nitride semiconductor is substantially parallel to the stacking direction (the Z axis). The a axis of the nitride semiconductor is substantially perpendicular to the Z axis.

The AlN buffer layer 22 is provided on the first surface 10a of the substrate 10. The AlN buffer layer 22 is a nucleation layer for the crystal growth of a nitride semiconductor. For example, the Al composition ratio to the group III elements of the AlN buffer layer 22 is 1. The AlN buffer layer 22 may include, for example, aluminum nitride (AlN).

Chemical reactions do not occur easily between AlN and silicon. By providing the AlN buffer layer 22 that includes AlN in contact with the substrate 10, meltback etching that occurs due to a reaction between silicon and gallium, etc., are suppressed.

It is favorable for the thickness of the AlN buffer layer 22 to be, for example, not less than 20 nm (nanometers) and not more than 400 nm, e.g., about 100 nm.

The foundation layer 24 is provided on the AlN buffer layer 22. The foundation layer 24 includes a nitride semiconductor that includes Al and Ga. It is favorable for the Al composition ratio to the group III elements of the foundation layer 24 to be, for example, not less than 0.1 and not more than 0.9. It is more favorable to be not less than 0.2 and not more than 0.6. The Al composition ratio is the proportion of the number of the Al element atoms to the number of the group III element atoms. It is favorable for the thickness of the foundation layer 24 to be, for example, not less than 100 nm and not more than 500 nm, e.g., about 250 nm.

The Al composition ratio of the foundation layer 24 on the substrate 10 side may be higher than the Al composition ratio on the upper side of the foundation layer 24 (the first high Ga composition layer 30 side described below). For example, the foundation layer 24 may include multiple layers. For example, the foundation layer 24 includes a first layer provided on the AlN buffer layer 22, a second layer provided on the first layer, and a third layer provided on the second layer. In such a case, the Al composition ratio of the first layer is higher than the Al composition ratio of the third layer.

The suppression effect of the meltback etching increases due to the foundation layer 24. A compressive stress is formed inside the foundation layer 24; and the tensile stress that occurs due to the difference of the coefficients of thermal expansion between the nitride semiconductor and the substrate 10 in the cooling process after the crystal growth is reduced. Thereby, the occurrence of cracks is suppressed.

In the case where multiple nitride semiconductor layers having mutually different compositions are stacked, the nitride semiconductor layer (e.g., the foundation layer 24) that is stacked on top is formed to match the lattice spacing (the length of the lattice) along a first axis parallel to the first surface 10a of the nitride semiconductor layer (e.g., the AlN buffer layer 22) that is formed underneath. Therefore, the actual lattice spacing along the first axis of the nitride semiconductor layer is different from the unstrained lattice spacing (the lattice constant) along the first axis.

Herein, the lattice constant is taken to be the unstrained lattice spacing along the first axis of the nitride semiconductor. The lattice spacing is taken to be the length along the first axis of the actual lattice of the nitride semiconductor layer that is formed. The lattice constant is, for example, a physical property constant. The lattice spacing is, for example, the length of the actual lattice of the nitride semiconductor layer included in the nitride semiconductor device that is formed. The lattice spacing is ascertained, for example, from X-ray diffraction measurements.

The first high Ga composition layer 30 is provided on the foundation layer 24. The first high Ga composition layer 30 includes the nitride semiconductor. The Al composition ratio to the group III elements of the first high Ga composition layer 30 is, for example, not more than 0.01. The first high Ga composition layer 30 may include, for example, gallium nitride (GaN).

The thickness of the first high Ga composition layer 30 is, for example, not less than 100 nanometers and not more than 5 micrometers.

The high Al composition layer 42 is provided on the first high Ga composition layer 30. The high Al composition layer 42 includes the nitride semiconductor. The Ga composition ratio of the high Al composition layer 42 is lower than the Ga composition ratio of the first high Ga composition layer 30. For example, the Ga composition ratio to the group III elements of the high Al composition layer 42 is not more than 0.01. The high Al composition layer 42 includes $Al_xGa_{1-x1}N$ ($0<x1\leq1$). For example, the high Al composition layer 42 includes AlN.

The thickness of the high Al composition layer 42 is not less than 2 nm and not more than 50 nm.

The low Al composition layer 44 is provided on the high Al composition layer 42. The low Al composition layer 44 includes the nitride semiconductor. The Ga composition ratio of the low Al composition layer 44 is lower than the Ga composition ratio of the first high Ga composition layer. The Al composition ratio of the low Al composition layer 44 is lower than the Al composition ratio of the high Al composition layer 42. The low Al composition layer 44 may include In.

The low Al composition layer 44 may include $Al_{y1}Ga_{1-y1}N$ ($0<y1<1$ and $y1<x1$). The Al composition ratio to the group III elements of the low Al composition layer 44 is not less than 0.2 and not more than 0.9. The thickness of the low Al composition layer 44 is not less than 10 nm and not more than 50 nm.

An impurity such as an acceptor or a donor is not doped into the high Al composition layer 42 and the low Al composition layer 44. The impurity concentrations of the high Al composition layer 42 and the low Al composition layer 44 are not more than $1 \times 10^{18}$ cm$^{-3}$. Thereby, the strain of the low Al composition layer 44 is not affected by an impurity.

The intermediate unit 50 will now be described.

Figure 2:
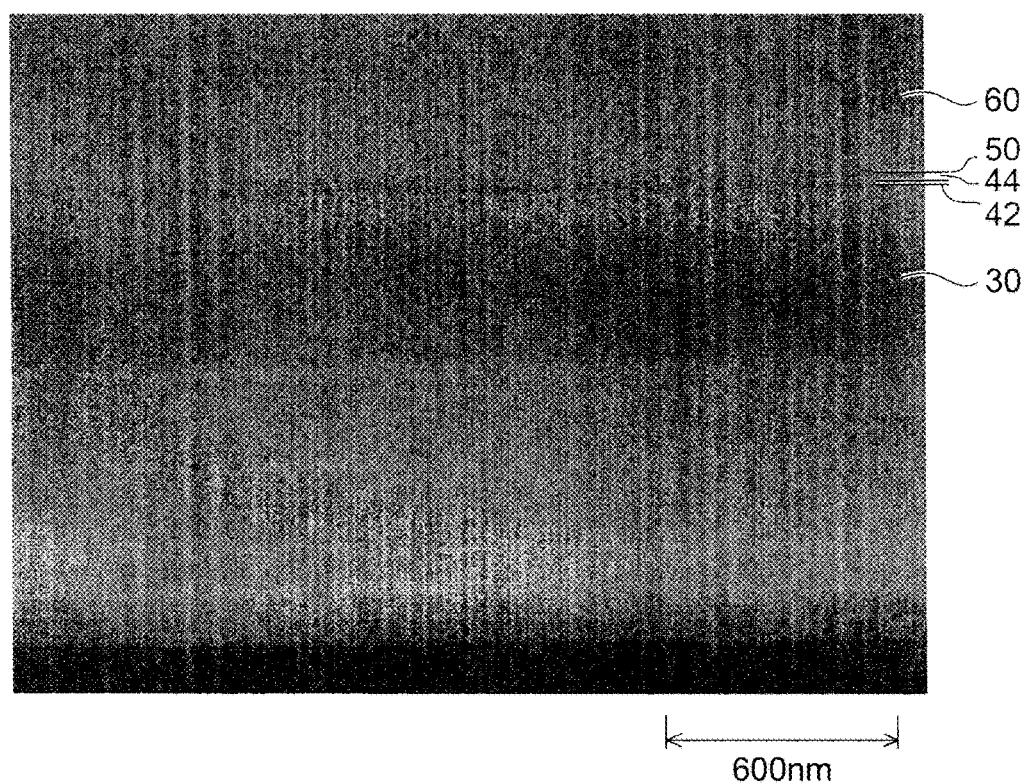
FIG. 2 shows the semiconductor wafer according to the first embodiment.

FIG. 2 shows the semiconductor wafer according to the first embodiment.

FIG. 2 shows a cross section SEM (Scanning Electron Microscopy) image of the semiconductor wafer 110.

As shown in FIG. 2, the intermediate unit 50 is provided on the low Al composition layer 44. The concentration of one selected from Si, Mg, and B is higher for the intermediate unit 50 than for the high Al composition layer 42 and the low Al composition layer 44. The intermediate unit 50 includes one selected from SiN, MgN, and BN. In the case where the intermediate unit 50 is formed of these materials, a nitride semiconductor does not epitaxially grow directly on the intermediate unit 50.

The thickness of the intermediate unit 50 is, for example, thinner than the thickness of the high Al composition layer 42. In the cross section SEM image, the intermediate unit 50 is observed to be a layer that is thinner than the high Al composition layer 42 and the low Al composition layer 44.

The thickness of the intermediate unit 50 corresponds to, for example, being not less than a 0.2 atom layer and not more than 3 nm. The intermediate unit 50 substantially partially covers the first high Ga composition layer 30 from above. Although the thickness of the intermediate unit 50 cannot be rigorously measured, the thickness of the intermediate unit 50 is adjusted by the formation conditions and the formation time of the intermediate unit 50. The thickness of the intermediate unit 50 can be estimated, for example, from a Si concentration profile of SIMS measurement. The second high Ga composition layer 60 epitaxially grows based on the crystallinity of the layer below the intermediate unit 50 when the thickness of the intermediate unit 50 is not less than a 0.2 atom layer and not more than 3 nm. Also, the dislocation density of the second high Ga composition layer 60 described below decreases.

Figure 3A:
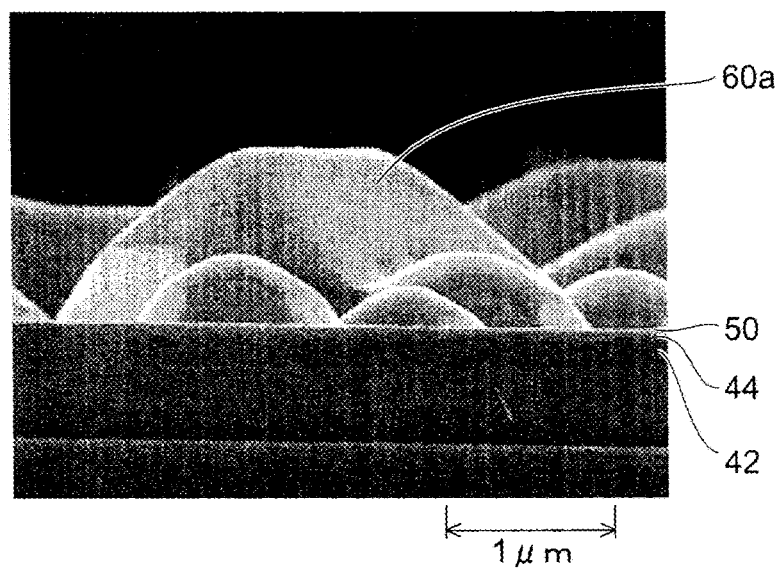
FIG. 3A, FIG. 3B, and FIG. 3C show the semiconductor wafer according to the first embodiment.
Figure 3B:
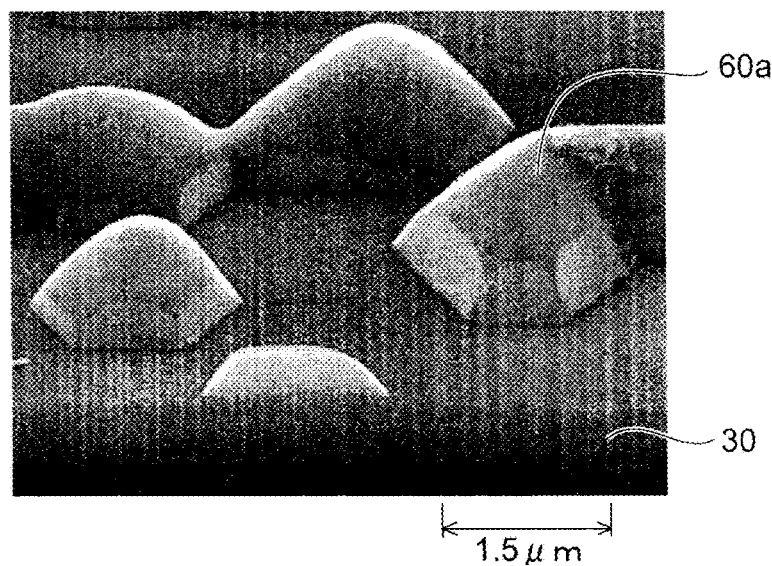
Figure 3C:
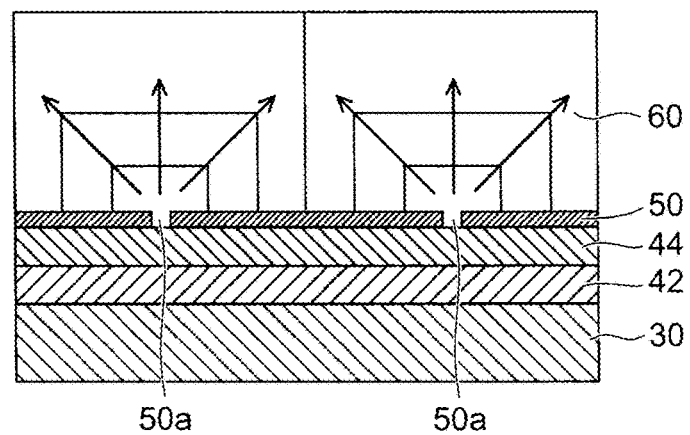

FIG. 3A, FIG. 3B, and FIG. 3C show the semiconductor wafer according to the first embodiment.

FIG. 3A is a cross section SEM image of the growth stage of the second high Ga composition layer 60 described below.

FIG. 3B is a perspective SEM image of the growth stage of the second high Ga composition layer 60 described below.

FIG. 3C is a schematic cross-sectional view of the growth stage of the second high Ga composition layer 60. In this drawing, the arrows illustrate the growth directions of the second high Ga composition layer 60.

As shown in FIG. 3A and FIG. 3B, the second high Ga composition layer 60 described below grows in an island configuration on the intermediate unit 50. The second high Ga composition layer 60 grows due to the growth of island-like portions 60a.

From FIG. 3A and FIG. 3B, the intermediate unit 50 is provided, for example, as follows.

As shown in FIG. 3C, the intermediate unit 50 is provided, for example, discontinuously. The intermediate unit 50 has multiple openings 50a where the high Al composition layer 42 is exposed. The intermediate unit 50 is provided, for example, in an island configuration.

It is considered that the second high Ga composition layer 60 grows in the island configuration via the openings 50a of the intermediate unit 50. Thereby, compressive strain applied to the second high Ga composition layer 60 during the growth decreases, even though the second high Ga composition layer 60 is grown on the low Al composition layer 44 which has lattice spacing that is smaller than the lattice spacing of GaN. As a result, the second high Ga composition layer 60 has tensile strain or small compressive strain.

The second high Ga composition layer 60 will now be described.

The second high Ga composition layer 60 is provided on the intermediate unit 50. The second Ga composition layer 60 includes the nitride semiconductor. The Ga composition ratio of the second high Ga composition layer 60 is higher than the Ga composition ratio of the low Al composition layer 44. The Al composition ratio to the group III elements of the second high Ga composition layer 60 is, for example, not more than 0.01. The second high Ga composition layer 60 may include, for example, gallium nitride (GaN).

The thickness of the second high Ga composition layer 60 is, for example, not less than 100 nanometers and not more than 5 micrometer.

The tensile strain of the second high Ga composition layer 60 is larger than the tensile strain of the first high Ga composition layer 30. Alternatively, the compressive strain of the second high Ga composition layer 60 is smaller than the compressive strain of the first high Ga composition layer 30. Alternatively, the second high Ga composition layer 60 has tensile strain and the first high Ga composition layer 30 has compressive strain. Thereby, the dislocation density of the second high Ga composition layer 60 decreases.

In the embodiment, the dislocation density of the second high Ga composition layer 60 is not more than $2 \times 10^9$/cm$^2$ by the semiconductor wafer 110 having the configuration recited above. An example of the dislocation density is described below.

The crystal distortion of the semiconductor wafer 110 will now be described.

The crystal distortion of the semiconductor wafer 110 is determined by, for example, Raman spectroscopy as recited below.

Figure 4:
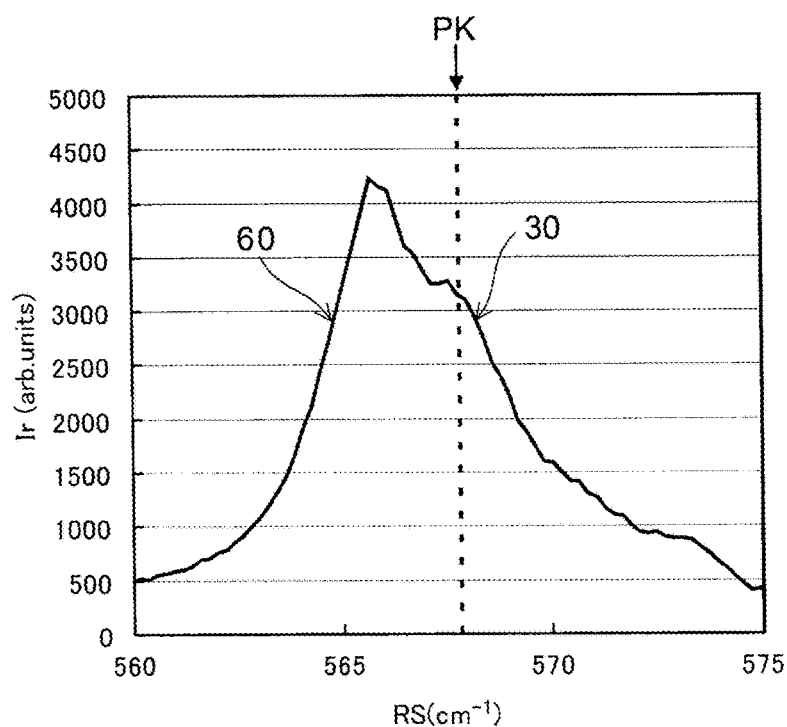
FIG. 4 to FIG. 6 are graphs illustrating characteristics of the semiconductor wafer.

FIG. 4 is a graph showing characteristics of the semiconductor wafer.

FIG. 4 shows the Raman spectroscopy results of the semiconductor wafer 110. In this graph, the Raman spectrum corresponding to GaN is shown.

The horizontal axis of FIG. 4 is a Raman shift RS (wave number (cm$^{-1}$)). The vertical axis of FIG. 4 is an intensity Ir of the Raman scattering (arbitrary units).

As shown in FIG. 4, the peak wave number PK of the Raman shift RS of GaN is 568 cm$^{-1}$ when stress is not applied to the GaN (when the GaN is unstrained). For example, the peak wave number PK of the Raman shift RS of the first high Ga composition layer 30 of the semiconductor wafer 110 is 567.6 cm$^{-1}$. The peak wave number PK of the Raman shift RS of the first high Ga composition layer 30 is shifted slightly toward the low wave number side than is the peak wave number PK of the Raman shift RS of the GaN when the stress is not applied. The first high Ga composition layer 30 has slight compressive strain in the inner-plane direction.

For example, for the second high Ga composition layer 60 of the semiconductor wafer 110, the Raman shift RS where the intensity Ir has a peak is 565.9 cm$^{-1}$. The peak wave number of the Raman shift RS of the second high Ga composition layer 60 is shifted clearly toward the low wave number side than is the peak wave number PK of the Raman shift RS of the GaN when the stress is not applied. The second low Ga composition layer 60 has tensile strain in the inner-plane direction. The amount of shift toward the low wave number side of the second high Ga composition layer 60 is larger than the amount of shift of the first high Ga composition layer 30. As described above, the tensile strain of the second high Ga composition layer 60 is larger than the tensile strain of the first high Ga composition layer 30.

The crystal distortion of the semiconductor wafer 110 also is determined by, for example, X-ray diffraction measurements as recited below.

Figure 5:
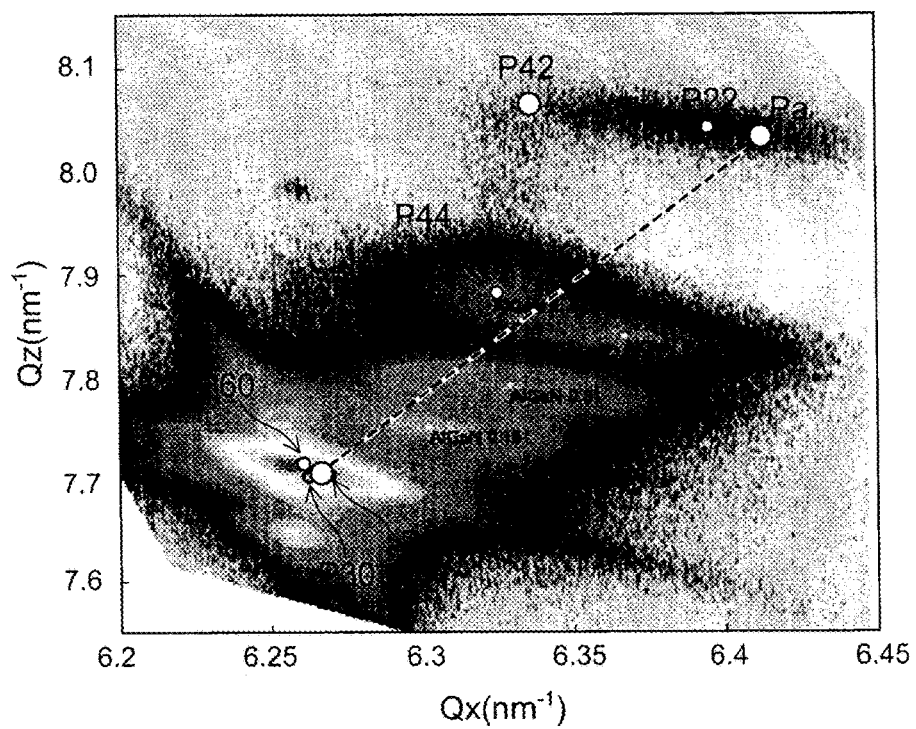

FIG. 5 is a graph showing characteristics of the semiconductor wafer.

FIG. 5 is an example of a reciprocal lattice mapping image of the (11-24) plane measured by X-ray diffraction.

The horizontal axis of FIG. 5 is a reciprocal Qx of the lattice spacing of the (11-20) plane in a direction perpendicular to the stacking direction. Qx is a value that is proportional to the reciprocal of the lattice spacing of the a axis.

The vertical axis of FIG. 5 is a reciprocal Qz of the lattice plane spacing of the (0004) plane in a direction parallel in the stacking direction. Qz is a value that is proportional to the reciprocal of the lattice spacing of the c axis.

In order to improve the accuracy of the measurement value, for example, the measured peak position may be corrected by obtaining the strain of the GaN layer from Raman spectroscopy. For example, the measured peak position may be corrected by calculating the strain of the AlN buffer layer from warpage change of the wafer during the growth.

FIG. 5 shows a diffraction peak Pg of the (11-24) plane of unstrained GaN and a diffraction peak Pa of the (11-24) plane of unstrained AlN. A dotted line Lag connecting these points illustrates the characteristic of the reciprocal of the lattice spacing corresponding to the Al composition ratio of unstrained AlGaN according to Vegard's law.

Here, the crystal has compressive strain in the case where the peak of the crystal is below the dotted line Lag. On the other hand, the crystal has tensile strain in the case where the peak of the crystal is above the dotted line.

FIG. 5 shows a diffraction peak P22 of the AlN buffer layer 22, a diffraction peak P30 of the (11-24) plane of the first high Ga composition layer 30, a diffraction peak P42 of the (11-24) plane of the high Al composition layer 42, a diffraction peak P44 of the (11-24) plane of the low Al composition layer 44, and a diffraction peak P60 of the (11-24) plane of the second high Ga composition layer 60.

For example, the diffraction peak P30 is on the substantially same position as the diffraction peak Pg. Accordingly, the first high Ga composition layer 30 has almost no compressive strain in an average over the whole layer. In such a case, the tensile stress that occurs due to the difference of the coefficients of thermal expansion between the first high Ga composition layer 30 and the substrate 10 in the cooling process after the crystal growth is suppressed. Thereby, the occurrence of cracks is suppressed.

For example, the diffraction peak P60 is on the upper side of the dotted line Lag. Accordingly, the second high Ga composition layer 60 has tensile strain. Qx of the diffraction peak P60 is lower than Qx of the diffraction peak P30. Accordingly, the tensile strain of the second high Ga composition layer 60 is larger than the tensile strain of the first high Ga composition layer 30.

For example, the diffraction peak P42 is on the upper side of the dotted line Lag. Accordingly, the high Al composition layer 42 has tensile strain.

In FIG. 5, for example, the difference of Qx between the diffraction peak Pa and the diffraction peak P42 is larger than the difference of Qx between the diffraction peak Pg and the diffraction peak P60. The tensile strain of the high Al composition layer 42 is larger than the tensile strain of the first high Ga composition layer 30 and the tensile strain of the second high Ga composition layer 60.

For example, the diffraction peak P44 is positioned above the dotted line Lag. The tensile strain of the low Al composition layer 44 is smaller than the tensile strain of the high Al composition layer 42. The value of Qx of the diffraction peak P42 is close to the value of Qx of the diffraction peak P44. For example, the low Al composition layer 44 is unstrained.

Figure 6:
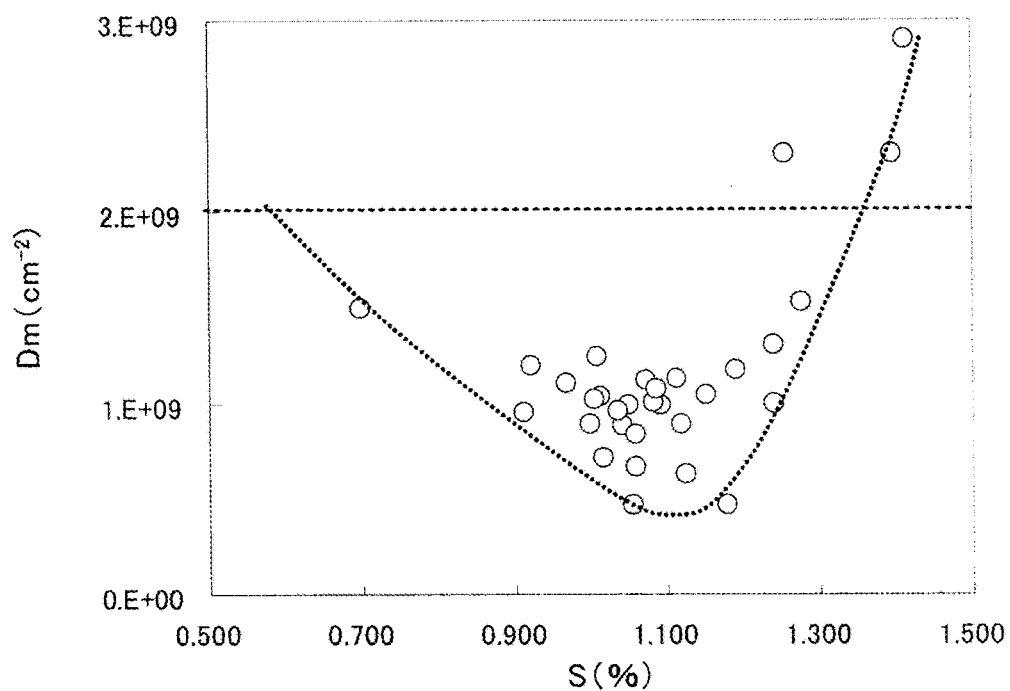

FIG. 6 is a graph showing characteristics of the semiconductor wafer.

FIG. 6 shows the wafer having the Al composition of the low Al composition layer of generally 0.4 to 0.6.

The horizontal axis of FIG. 6 is a proportion S (hereinbelow, called S of the tensile strain) (%) of the difference between the lattice spacing of the high Al composition layer 42 and an unstrained lattice spacing of nitride semiconductor having the same composition as the high Al composition layer 42 to the unstrained lattice spacing.

The vertical axis of FIG. 6 is a density Dm of edge dislocations (hereinbelow, the dislocation density Dm) (cm$^{-2}$). The dislocation density Dm is calculated from the width at half maximum of the X-ray diffraction spectrum obtained by X-ray diffraction rocking curve measurements.

As shown in FIG. 6, the dislocation density Dm protrudes downward with the proportion S of the tensile strain. From this result, it is favorable for the proportion S of the difference between the tensile strain of the high Al composition layer 42 and the tensile strain of the second high Ga composition layer 60 to the tensile strain of the high Al composition layer 42 to be not less than 0.6% and not more than 1.4%. By the proportion S being within the range recited above, the dislocation density Dm decreases. In contrast, the tensile strain of the first high Ga composition layer 30 and the second high Ga composition layer 60 is approximately 0.3% at maximum. If the tensile strain of the first high Ga composition layer 30 and the second high Ga composition layer 60 is 0.3% or more, the density of crack increases and practical utility is low. In this manner, the tensile strain of the high Al composition layer 42 is larger than the tensile strain of the first high Ga composition layer 30 and the tensile strain of the second high Ga composition layer.

Figure 7:
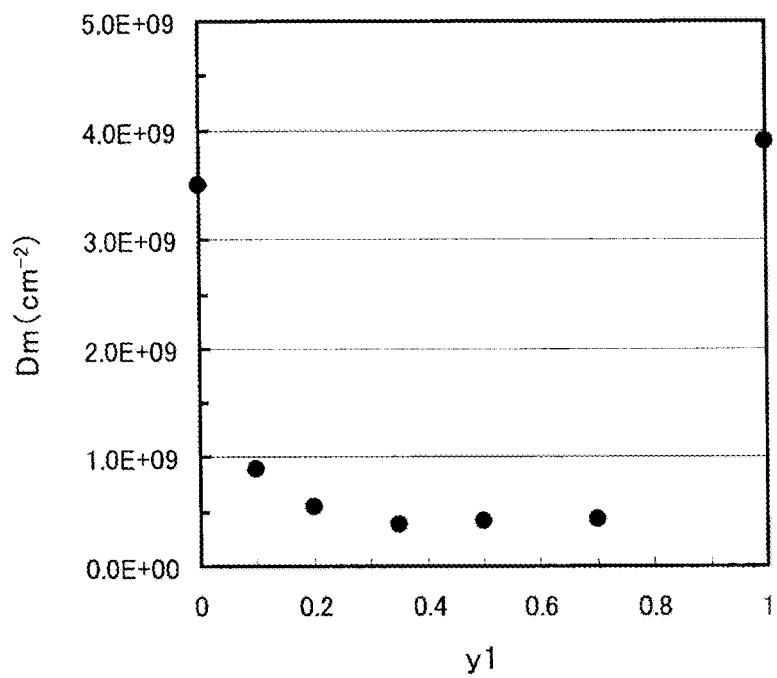
FIG. 7 is a graph illustrating characteristics of the semiconductor wafer.

FIG. 7 is a graph illustrating characteristics of the semiconductor wafer. FIG. 7 shows the wafer having the proportion S of the tensile strain of the high Al composition layer 42 of generally 0.9 to 1.2%.

The horizontal axis of FIG. 7 is an Al composition y1 of the low Al composition layer 44 ($Al_{y1}Ga_{1-y1}N$). The vertical axis of FIG. 7 is a density Dm (cm$^{-2}$). The dislocation density Dm is calculated from the width at half maximum of the X-ray diffraction spectrum obtained by X-ray diffraction rocking curve measurements.

As shown in FIG. 7, the dislocation density Dm protrudes downward with the Al composition y1 of the low Al composition layer 44. From this result, it is favorable for the Al composition of the low Al composition layer 44 to be not less than 0.2 and not more than 0.8, furthermore favorable to be not less than 0.2 and not more than 0.7. By the Al composition of the low Al composition layer 44 being within the range recited above, the dislocation density Dm decreases.

Next, characteristics of the semiconductor wafer 110 according to the first embodiment will now be described in comparison to reference examples.

Figure 8A:
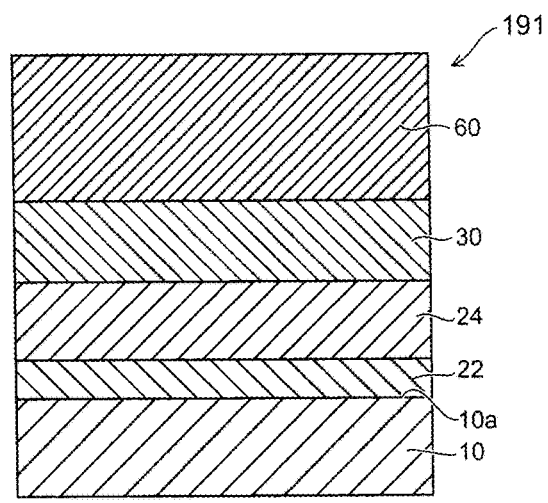
FIG. 8A, FIG. 8B and FIG. 8C are views showing a semiconductor wafer according to reference examples.
Figure 8B:
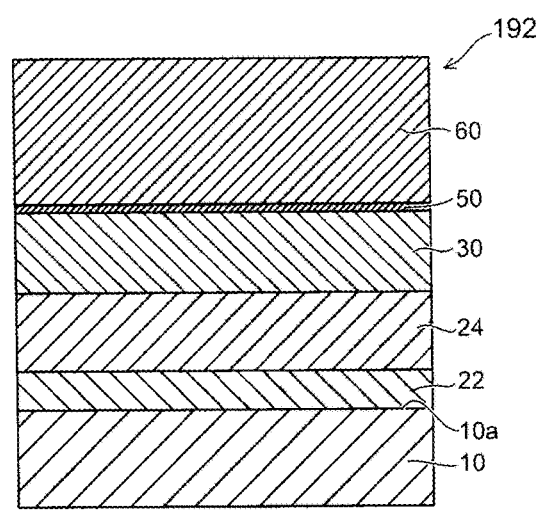
Figure 8C:
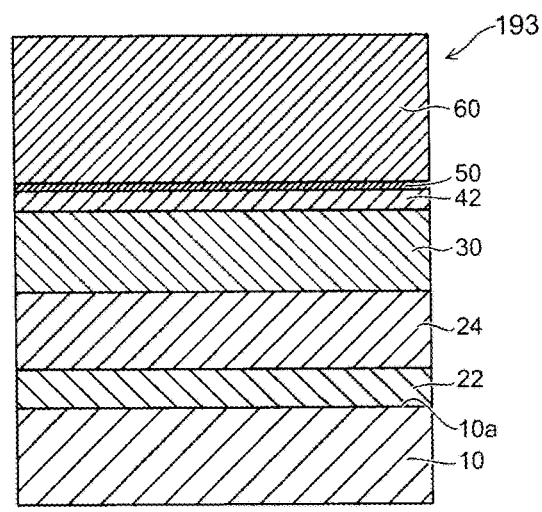

FIG. 8A, FIG. 8B and FIG. 8C are views showing a semiconductor wafer according to reference examples.

FIG. 8A is a view showing a semiconductor wafer 191 of a first reference example.

FIG. 8B is a view showing a semiconductor wafer 192 of a second reference example.

FIG. 8C is a view showing a semiconductor wafer 193 of a third reference example.

As shown in FIG. 8A, the semiconductor wafer 191 of the first reference example differs from the semiconductor wafer 110 in that the intermediate unit 50, the high Al composition layer 42 and the low Al composition layer 44 are not included. In the first reference example, the second high Ga composition layer 60 contacts the first high Al composition layer 30.

As shown in FIG. 8B, the semiconductor wafer 192 of the second reference example differs from the semiconductor wafer 110 in that the high Al composition layer 42 and the low Al composition layer 44 are not included. In the second reference example, the intermediate unit 50 contacts the first high Ga composition layer 30.

As shown in FIG. 8C, the semiconductor wafer 193 of the third reference example differs from the semiconductor wafer 110 in that the low Al composition layer 44 is not included. In the third reference example, the intermediate unit 50 contacts the high Al composition layer 42.

Here, the density of the edge dislocations is compared for the semiconductor wafers 191 to 193 of the first to third reference examples and the semiconductor wafer 110 made by the following conditions.

The conditions for making the semiconductor wafer 110 are as recited below.

A Si substrate of the (111) plane is used as the substrate 10.

The AlN buffer layer 22 includes AlN. The thickness of the AlN buffer layer 22 is 120 nm.

The foundation layer 24 includes a first layer of $Al_{0.5}Ga_{0.5}N$, a second layer of $Al_{0.3}Ga_{0.7}N$, and a third layer of $Al_{0.15}Ga_{0.85}N$. The thickness of the entire foundation layer 24 is 550 nm.

The first high Ga composition layer 30 includes GaN. The thickness of the first high Ga composition layer 30 is 400 nm.

The high Al composition layer 42 includes AlN. The thickness of the high Al composition layer 42 is 12 nm.

The low Al composition layer 44 includes $Al_{0.5}Ga_{0.5}N$. The thickness of the low Al composition layer 44 is 25 nm.

The intermediate unit 50 is a layer including Si. The intermediate unit 50 may include SiN. The thickness of the intermediate unit 50 is, for example, considerable 0.2 atom layer to 3 nm.

The second high Ga composition layer 60 includes GaN. The thickness of the second high Ga composition layer 60 is 2 micrometers (μm).

Other than the differences recited above, the configurations of the semiconductor wafers 191 to 193 of the first to third reference examples are similar to the configuration of the semiconductor wafer 110.

The density of the edge dislocations calculated from the width at half maximum of the X-ray diffraction spectrum obtained by the X-ray diffraction rocking curve measurements of the semiconductor wafers 191 to 193 of the first to third reference examples and the semiconductor wafer 110 made by the conditions recited above are as follows.

The density of the edge dislocations of the semiconductor wafer 191 of the first reference example was $7.5 \times 10^9$ $cm^{-2}$.

The density of the edge dislocations of the semiconductor wafer 192 of the second reference example was $1.5 \times 10^9$ $cm^{-2}$.

The density of the edge dislocations of the semiconductor wafer 193 of the third reference example was $1.5 \times 10^9$ $cm^{-2}$.

Conversely, the density of the edge dislocations of the semiconductor wafer 110 was $4.7 \times 10^8$ $cm^{-2}$. Thus, in the semiconductor wafer 110 of the embodiment, the edge dislocation density is low.

In the first reference example, the edge dislocations occurring in the first high Ga composition layer 30 propagate to the second high Ga composition layer 60. Accordingly, the edge dislocation density of the first reference example is high.

In the second reference example, the edge dislocations occurring in the first high Ga composition layer 30 are shielded by the intermediate unit 50. Thereby, the density of the edge dislocations of the second reference example is lower than the density of the edge dislocations of the first reference example.

In the third reference example as well, the density of the edge dislocations is lower than the density of the edge dislocations of the first reference example.

Conversely, the inventors discovered that the density of the edge dislocations markedly decreases by the semiconductor wafer 110 having a configuration such as that recited below.

In the semiconductor wafer 110 of the first embodiment, the low Al composition layer 44 is provided on the high Al composition layer 42. The tensile strain of the second high Ga composition layer 60 is larger than the tensile strain of the first high Ga composition layer 30. Thereby, in the semiconductor wafer 110, the density of the edge dislocations is markedly lower than the densities of the edge dislocations of the semiconductor wafers 191 to 193 of the first to third reference examples.

In the first embodiment, the second high Ga composition layer 60 grows as isolated island-like crystals on the low Al composition layer 44 and the intermediate unit 50. The multiple island-like crystals coalesce with one another by completion of the growth of the second high Ga composition layer 60 to be one continuous layer. In the case of the growth like this, compressive strain applied during the growth of the second high Ga composition layer 60 decreases and the dislocation density reduces markedly. After the growth, the second Ga high composition layer 60 has a larger tensile strain due to the difference of the coefficient of thermal expansion from the substrate.

The high Al composition layer 42 does not relax completely and receives tensile strain of not less than 0.6% and not more than 1.4% during the growth. For this reason, lattice mismatch factor between the high Al composition layer 42 and a layer contacting under the high Al composition layer 42, for example, the first high Ga composition layer 30 decreases. Because of this, dislocations occurring in the high Al composition layer 42 from the interface between the high Al composition layer 42 and the first high Ga composition layer 30 and propagating to the upper layer from the high Al composition layer 42 becomes less.

Furthermore, if a low Al composition layer having the Al composition of not less than 0.2 and not more than 0.8 grows on the high Al composition layer 42 having tensile strain of not less than 0.6% and not more than 1.4% received, the strain applied during the growth is decreased and the flattened low Al composition layer 44 is obtained. This makes it easy for the second high Ga composition layer 60 to grow as isolated island-like crystal on the low Al composition layer 44 and the intermediate unit 50, and makes it hard for dislocations propagating from below to propagate in the second high Ga composition layer 60.

In the third reference example, since the low Al composition layer 44 is not included, the intermediate unit 50 is grown on the surface of the high Al composition layer 42 with bad flatness. It is considered that this makes degrade effect blocking the dislocations in the intermediate unit 50. The second high Ga composition layer 60 growing on the high Al composition layer 42 with bad flatness and on the intermediate unit 50 formed on the high Al composition layer 42 is hard to be island-like crystal and easy to be flattened. This does not reduce the dislocation density and the compressive strain is easy to be applied.

In the second reference example, the low Al composition layer 44 and the high Al composition layer 42 are not included. For this reason, the second high Ga composition layer 60 is hard to be island-like crystal and easy to be flattened. It is considered to be for this reason that a layer serving as a foundation layer of the intermediate unit 50 is the first high Ga composition layer 30 and a difference between the lattice spacing of the second high Ga composition layer 60 and the lattice spacing of the first high Ga composition layer 30 is small. Therefore, the dislocation density is hard to be reduced.

Generally, an Al containing layer called the high Al composition layer 42 inserted into the high Ga composition layer in the embodiment is mainly used for suppressing cracks. That is, it is used for applying compressive stress to the high Ga composition layer on the Al containing layer. For this reason, in the high Ga composition layer, tensile strain on a lower side of the Al containing layer is larger than tensile strain on an upper side of the Al containing layer.

However, in the embodiment, the second high Ga composition layer 60 is grown as an island-like crystal layer on the high Al composition layer 42, the low Al composition layer 42, the low Al composition layer 44 and the intermediate unit 50. As a result, the dislocation density is markedly reduced. In the embodiment, the tensile strain of the second high Ga composition layer 60 becomes larger than the tensile strain of the first high Ga composition layer 30.

Furthermore, in general, a layer corresponding to the high Al composition layer 42 is called "intermediate layer", and it is disclosed that the high Al composition layer 42 is substantially relaxed. However, the high Al composition layer 42 in the embodiment has large tensile strain. It is considered that this causes the low Al composition layer 44 to be formed with flatness, makes it easy for the second high Ga composition layer 60 to grow as the island-like crystal, and reduces the dislocation density markedly.

On the other hand, in the embodiment, since the second high Ga composition layer 60 has tensile strain, cracks tend to be likely to occur. The cracks can be suppressed from occurring by increasing compressive strain of the first high Ga composition layer 30 and the foundation layer 24. Although depending on strength of the compressive strain, the cracks can be suppressed from occurring by setting sum of the thickness of the first high Ga composition layer 30 and the thickness of the foundation layer 24 larger than the thickness of the second high Ga composition layer 60 and setting warpage of the substrate after the growth generally flat. For this reason, the tensile strain of the second high Ga composition layer 60 becomes larger than the tensile strain of the first high Ga composition layer 30.

Second Embodiment

Figure 9:
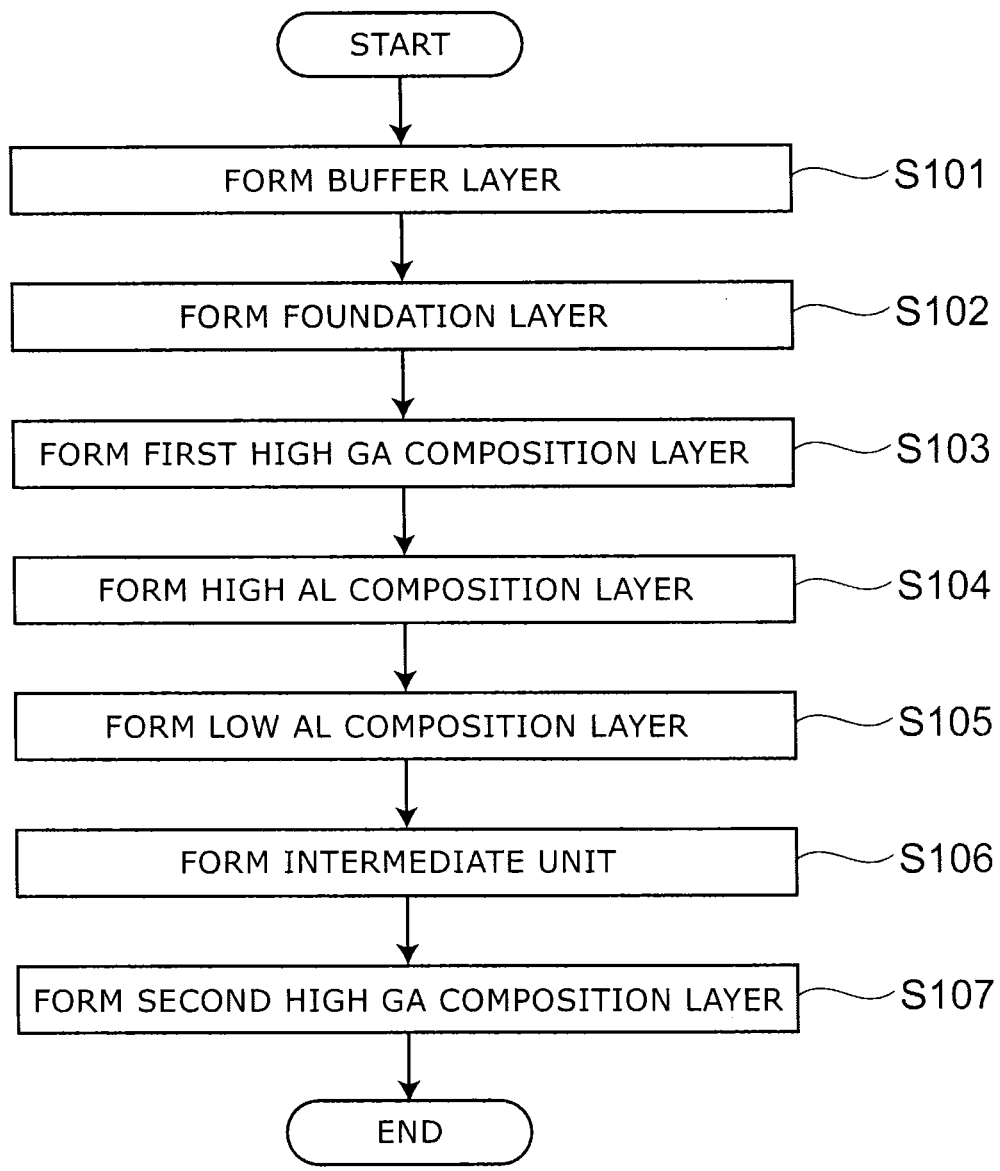
FIG. 9 is a flowchart showing a method for manufacturing a nitride semiconductor layer according to a second embodiment.

FIG. 9 is a flowchart showing a method for manufacturing a nitride semiconductor layer according to a second embodiment.

Figure 10:
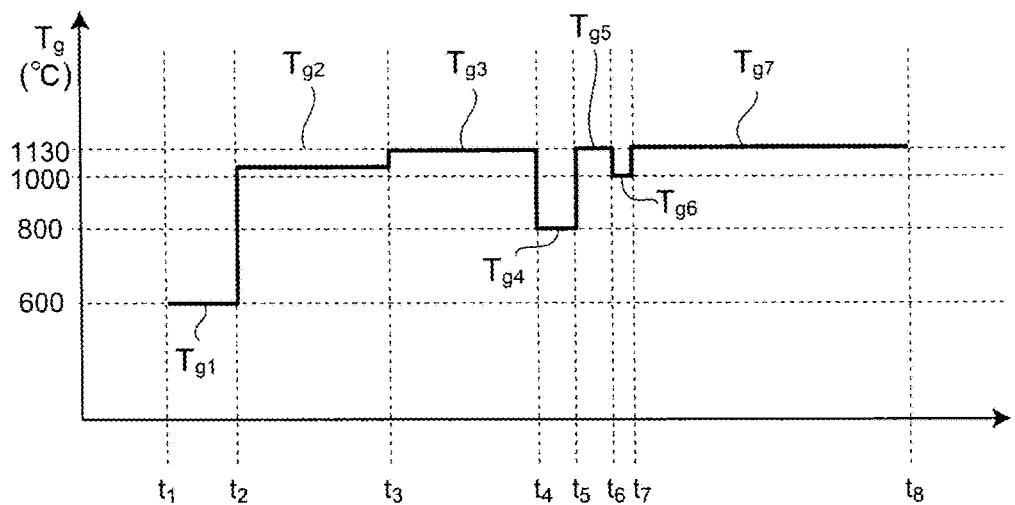
FIG. 10 is a graph showing growth temperatures of the second embodiment.

FIG. 10 is a graph showing growth temperatures of the second embodiment. In this graph, the heating processes and the cooling processes are not shown.

As shown in FIG. 9, the method for manufacturing the nitride semiconductor layer according to the second embodiment includes forming an AlN buffer layer (step S101), forming a foundation layer (step S102), forming a first high Ga composition layer (step S103), forming a high Al composition layer (step S104), forming a low Al composition layer (step S105), forming an intermediate unit (step S106), and forming a second high Ga composition layer (step S107). Here, the nitride semiconductor layer includes at least the second high Ga composition layer 60. The details will now be described.

First, as shown in FIG. 10, the formation of the AlN buffer layer (step S101) is performed from a time $t_1$ to a time $t_2$. The AlN buffer layer 22 is formed on the substrate 10 at a first temperature $T_{g1}$. The first temperature $T_{g1}$ is, for example, not less than 500° C. and not more than 1000° C. For example, the first temperature $T_{g1}$ is 600° C.

Then, the formation of the foundation layer (step S102) is performed from the time $t_2$ to a time $t_3$. The foundation layer 24 including a nitride semiconductor that includes Al and Ga is formed on the AlN buffer layer 22 at a second growth temperature $T_{g2}$. The second growth temperature $T_{g2}$ is not less than 500° C. and not more than 1200° C. For example, the second growth temperature $T_{g2}$ is 1050° C. It is favorable for the Al composition ratio of the foundation layer 24 to be, for example, not less than 0.1 and not more than 0.9, and more favorably not less than 0.2 and not more than 0.6. The foundation layer 24 has, for example, a first layer of $Al_{0.5}Ga_{0.5}N$, a second layer of $Al_{0.3}Ga_{0.7}N$ and a third layer of $Al_{0.15}Ga_{0.85}N$. The thickness of the whole foundation layer 24 is, for example, 550 nm.

Continuing, the formation of the first high Ga composition layer (step S103) is performed from the time $t_3$ to a time $t_4$. The first high Ga composition layer 30 including the nitride semiconductor is formed on the foundation layer 24. For example, the first high Ga composition layer 30 is GaN.

A third growth temperature $T_{g3}$ (a first temperature) being a growth temperature of the first high Ga composition layer 30 is favorable to be, for example, not less than 1000° C. and not more than 1200° C., e.g., about 1130° C.

It is favorable for the lattice spacing of the a axis of the first high Ga composition layer 30 to be small because the compressive stress applied to the first high Ga composition layer 30 increases as the lattice spacing of the a axis of the first high Ga composition layer 30 decreases.

The lattice spacing of the a axis of the first high Ga composition layer 30 changes according to, for example, the ammonia partial pressure. For example, the lattice spacing of the a axis of the first high Ga composition layer 30 decreases as the ammonia partial pressure increases. It is favorable for the ammonia partial pressure to be, for example, not less than 0.2 and not more than 0.5.

The lattice spacing of the a axis of the first high Ga composition layer 30 changes according to, for example, the ratio (the V/III ratio) of the source-material gas of the group V atoms and the source-material gas of the group III atoms. For example, the lattice spacing of the a axis of the first high Ga composition layer 30 decreases as the V/III ratio increases. It is favorable for the V/III ratio to be, for example, not less than 4000 and not more than 15000.

Then, the formation of the high Al composition layer (step S104) is performed from the time $t_4$ to a time $t_5$. The high Al composition layer 42 including the nitride semiconductor is formed on the first high Ga composition layer 30. The Ga composition ratio of the high Al composition layer 42 is lower than the Ga composition ratio of the first high Ga composition layer 30.

A fourth growth temperature (a second temperature) being a growth temperature of the high Al composition layer 42 is lower than the third growth temperature $T_{g3}$.

The fourth growth temperature $T_{g4}$ is, for example, not less than 500° C. and not more than 1100° C., more favorably about 800° C.

When the fourth growth temperature $T_{g4}$ is lower than 500° C., impurities are introduced easily. Also, cubic crystal AlGaN, etc., is grown; and crystal dislocations undesirably occur excessively. Then, the crystal quality of the high Al composition layer 42 undesirably degrades excessively. When the growth temperature $T_{g4}$ is higher than 1100° C., there is a possibility that cracks may undesirably occur in the high Al composition layer 42.

It is favorable for the tensile strain of the high Al composition layer 42 to be larger than the tensile strain of the first high Ga composition layer 30 and the tensile strain of the second high Ga composition layer 60. For example, it is favorable for the high Al composition layer 42 to be formed by conditions such as those recited below.

For example, it is favorable for the ammonia partial pressure to be not less than 0.01 and not more than 0.2, and more favorably not less than 0.02 and not more than 0.15.

For example, it is favorable for the V/III ratio to be not less than 1000 and not more than 40000, and more favorably not less than 2000 and not more than 20000. The high Al composition layer 42 grows with tensile strain by conditions like this. This is confirmed by a warpage monitor of the substrate during the growth. After the growth, the tensile strain is further applied due to a difference of the coefficient of the thermal expansion from the substrate. The tensile strain observed at a room temperature is not less than 0.6% and not more than 1.4% based on an unstrained state.

Then, the formation of the low Al composition layer (step S105) is performed from the time $t_5$ to the time $t_6$. The low Al composition layer 44 including the nitride semiconductor is formed on the high Al composition layer 42. The Ga composition ratio of the low Al composition layer 44 is lower than the Ga composition ratio of the first high Ga composition layer 30. The Al composition ratio of the low Al composition layer 44 is lower than the Al composition ratio of the high Al composition layer 42.

A fifth growth temperature $T_{g5}$ being a growth temperature of the low Al composition layer 44 is a temperature that is higher than the fourth temperature $T_{g4}$. It is favorable for the fifth growth temperature $T_{g5}$ to be, for example, not less than 800° C. and not more than 1200° C., e.g., 1130° C.

The low Al composition layer 44 is formed so as to have Al composition of not less than 0.2 and not more than 0.8. Thereby, the low Al composition layer 44 grows on the high Al composition layer 42 with the same lattice spacing as that of the high Al composition layer 42 or with the lattice spacing close to that. For example, the low Al composition layer 44 grows in an unstrained or low strained state, and thereby a flat surface of the low Al composition layer 44 is obtained.

Then, the formation of the intermediate unit (step S106) is performed from the time $t_6$ to a time $t_7$. The intermediate unit 50 is formed on the low Al composition layer 44. The concentration of one selected from Si, Mg, and B is higher for the intermediate unit 50 than for the high Al composition layer 42 and the low Al composition layer 44. The intermediate unit 50 includes one selected from SiN, MgN, and BN.

A sixth growth temperature $T_{g6}$ being a growth temperature of the intermediate unit 50 is not less than 500° C. and not more than 1200° C. For example, the sixth growth temperature $T_{g6}$ is 1000° C.

The thickness of the intermediate unit 50 corresponds to, for example, being not less than a 0.2 atom layer and not more than 3 nm. For example, the thickness of the intermediate unit 50 is controlled by controlling the flow rate or the film formation time of the Si source-material gas.

The intermediate unit 50 is formed by, for example, the same apparatus that performs step S101 to step S105. Thereby, the intermediate unit 50 is formed merely by switching the gas that is introduced.

Then, the formation of the second high Ga composition layer (step S107) is performed from the time $t_7$ to a time $t_8$. The second high Ga composition layer 60 including the nitride semiconductor is formed on the intermediate unit 50. The Ga composition ratio of the second high Ga composition layer 60 is higher than the Ga composition ratio of the low Al composition layer 44. The second high Ga composition layer 60 is, for example, GaN.

A seventh growth temperature $T_{g7}$ being a growth temperature of the second high Ga composition layer 60 is higher than the first temperature $T_{g4}$. It is favorable for the seventh growth temperature $T_{g7}$ of the second high Ga composition layer 60 to be, for example, not less than 1000° C. and not more than 1200° C., e.g., about 1130° C.

As shown in FIG. 3A and FIG. 3B, the second high Ga composition layer 60 grows in an island configuration. The second high Ga composition layer 60 grows due to the growth of the island-like portions 60a. Thereby, the dislocation density in the semiconductor wafer 110 markedly decreases.

The compressive strain of the second high Ga composition layer 60 during the growth becomes markedly smaller than the compressive strain of the first high Ga composition layer 30. As a result, the second high Ga composition layer 60 has tensile strain or small compressive strain. The tensile strain of the second high Ga composition layer 60 after the growth is larger than the tensile strain of the first high Ga composition layer 30. Alternatively, the compressive strain of the second high Ga composition layer 60 after the growth is smaller than the compressive strain of the first high Ga composition layer 30. Alternatively, the second high Ga composition layer 60 after the growth has the tensile strain and the first high Ga composition layer 30 has the compressive strain.

The growth condition of the second high Ga composition layer 60 is similar to, for example, the growth condition of the first high Ga composition layer 30. The second high Ga composition layer 60 has the strain recited above by growing on the low Al composition layer 44 and the intermediate unit 50.

By the processes recited above, the semiconductor wafer 110 is formed.

Third Embodiment

Figure 11:
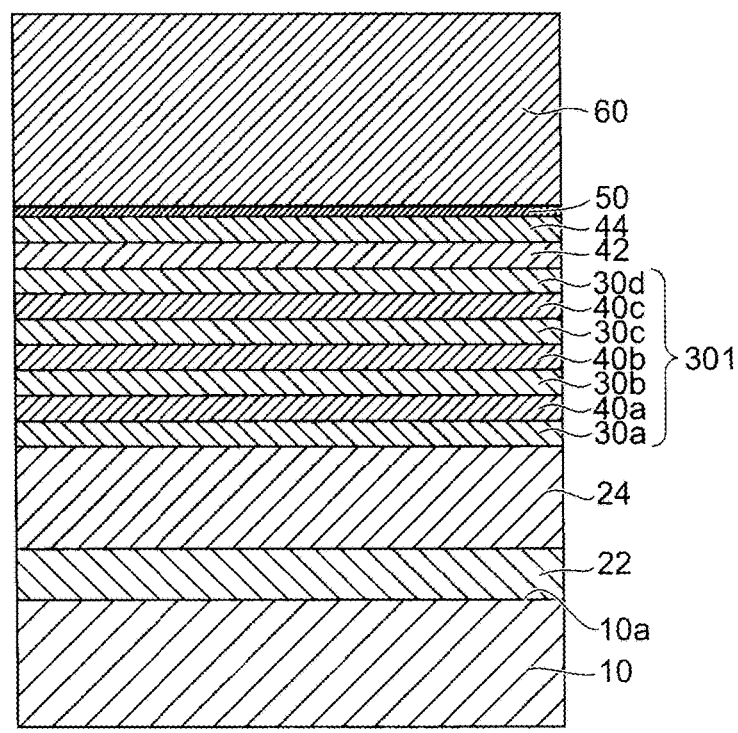
FIG. 11 is a schematic view showing a semiconductor wafer according to a third embodiment.

FIG. 11 is a schematic view showing a semiconductor wafer according to a third embodiment.

The semiconductor wafer 120 according to the third embodiment includes the substrate 10, the AlN buffer layer 22, the foundation layer 24, a first compressive stress storage layer 301, the high Al composition layer 42, the low Al composition layer 44, the intermediate layer 50 and the second high Ga composition layer 60.

The semiconductor wafer 120 according to the third embodiment includes the first compressive stress storage layer 301, the first high Ga composition layer 30 in the first embodiment being replaced by the first compressive stress storage layer 301. The first compressive stress storage layer 301 is provided between the foundation layer 24 and the high Al composition layer 42. The first compressive stress storage layer 301 has a structure having, for example, four layers of the high Ga composition layers 30a, 30b, 30c and 30d alternately stacked with, for example, three layers of the high Al composition layers 40a, 40b and 40c.

The high Ga composition layer 30a is provided on the foundation layer 24. The high Ga composition layer 30a includes a nitride semiconductor. An Al composition ratio to the group III elements in the high Ga composition layer 30a is not more than 0.01. The high Ga composition layer 30a includes, for example, gallium nitride (GaN). It is favorable for the thickness of the high Ga composition layer 30a to be, for example, not less than 300 nm and not more than 2 μm, for example, 400 nm. The compressive stress is applied to the high Ga composition layer 30a. The compressive stress decreases with increasing thickness of the high Ga composition layer 30a. The high Ga composition layer 30a may be thickened within a range in which the compressive stress can be held.

The high Al composition layer 40a is provided on the high Ga composition layer 30a. The high Al composition layer 40a includes a nitride semiconductor. A Ga composition ratio of the high Al composition layer 40a is lower than a Ga composition ratio of the high Ga composition layer 30a. For example, the Ga composition ratio to the group III elements in the high Al composition layer 40a is not more than 0.01. The high Al composition layer 40a includes $Al_{x1}Ga_{1-x1}N$ (o<x1≤1). For example, the high Al composition layer 40a includes AlN. The thickness of the high Al composition layer 40a is not less than 2 nm and not more than 50 nm, for example, 12 nm.

The high Ga composition layer 30b is provided on the high Al composition layer 40a. The high Ga composition layer 30b includes a nitride semiconductor, may have the same composition as the high Ga composition layer 30a, and for example, includes GaN. The high Ga composition layer 30b may have the same thickness as the high Ga composition layer 30a, for example, 400 nm. Compressive stress is applied to the high Ga composition layer 30b similar to the high Ga composition layer 30a.

After that, in the same manner, the high Al composition layer 40b, the high Ga composition layer 30c, the high Al composition layer 40c, and the high Ga composition layer 30d are stacked in this order. This stores the compressive stress in the first compressive stress storage layer 301. In the embodiment, the thickness of the high Ga composition layers 30a, 30b, 30c and 30d is taken as the same thickness as the high Al composition layers 40a, 40b and 40c, however may be changed within a range in which the compressive stress is obtained.

Similar to the first embodiment, the high Al composition layer 42, the low Al composition layer 44, the intermediate unit 50, and the second high Ga composition layer 60 are sequentially provided.

The tensile strain of the second high Ga composition layer 60 is larger than the tensile strain of the high Ga composition layer 30d. Alternatively, the compressive strain of the second high Ga composition layer 60 is smaller than the compressive strain of the high Ga composition layer 30d. Alternatively, the second high Ga composition layer 60 has the tensile strain and the high Ga composition layer 30d has the compressive strain. This decreases the dislocation density in the second high Ga composition layer 60.

The density of the edge dislocation of the semiconductor wafer 120 of the embodiment is $4.8 \times 10^8$ cm$^{-2}$. In the semiconductor wafer 120 of the embodiment, a compressive strain layer below the high Al composition layer 42 is thick compared with the semiconductor wager 110. For this reason, a wafer having crack occurrence suppressed is easily fabricated compared with the semiconductor wafer 110.

In the embodiment, an example of the structure having the high Ga composition layers of four layers stacked with the high Al composition layers of three layers alternately is shown as the first compressive stress storage layer 301, however layers other than the above layer number may be stacked. The first compressive stress storage layer 301 may have the structure having multiple high Ga composition layers stacked with multiple high Al composition layers alternately.

Fourth Embodiment

Figure 12:
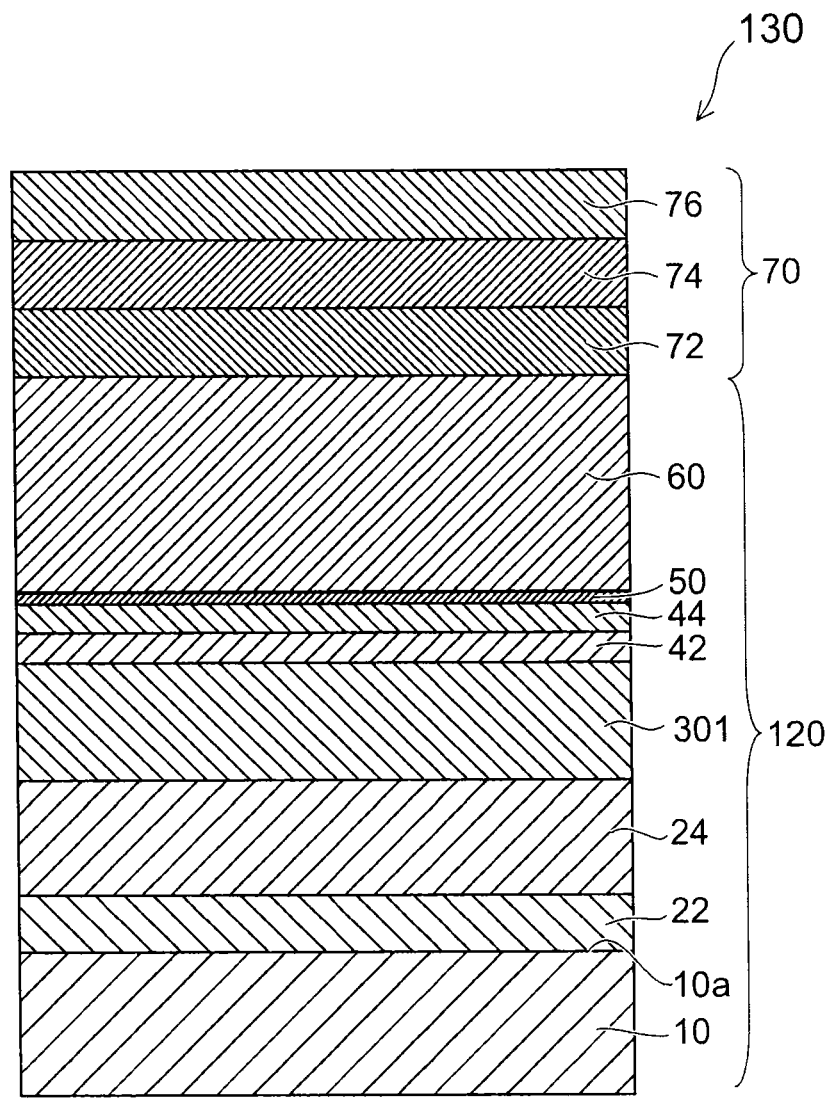
FIG. 12 is a schematic view showing a semiconductor device according to a fourth embodiment.

FIG. 12 is a schematic view showing a semiconductor device according to a fourth embodiment.

The semiconductor device 130 according to the embodiment includes a semiconductor apparatus such as a semiconductor light emitting device, a semiconductor light receiving device, an electronic device, etc. The semiconductor light emitting device includes, for example, a light emitting diode (LED), a laser diode (LD), etc. The semiconductor light receiving device includes a photodiode (PD), etc. The electronic device includes, for example, a high electron mobility transistor (HEMT), a heterojunction bipolar transistor (HBT), a field effect transistor (FET), a Schottky barrier diode (SBD), etc. In this example, the semiconductor device 130 is the semiconductor light emitting device.

The semiconductor device 130 is formed on the semiconductor wafer 120 of the third embodiment. The semiconductor device 130 includes a functional layer 70.

The functional layer 70 includes, for example, an n-type semiconductor layer 72, a light emitting layer 74, and a p-type semiconductor layer 76. The n-type semiconductor layer 72 is provided on the semiconductor wafer 120.

The light emitting layer 74 is provided on the n-type semiconductor layer 72. The light emitting layer 74 includes, for example, multiple barrier layers of GaN, and an InGaN (e.g., $In_{0.15}Ga_{0.85}N$) layer provided between the barrier layers. The light emitting layer 74 has a MQW (Multi-Quantum Well) structure or a SQW (Single-Quantum Well) structure.

The p-type semiconductor layer 76 is provided on the light emitting layer 74. Also, a p-electrode (not shown) may be provided on the p-type semiconductor layer 76. An n-electrode (not shown) may be provided in contact with the n-type semiconductor layer 72.

It is favorable for the thickness of the functional layer 70 to be, for example, not less than 1 micrometer (μm) and not more than 5 μm, e.g., about 3.5 μm.

There are cases where the semiconductor device 130 is used in the state in which the substrate 10 is removed. Also, there are cases where the semiconductor device 130 is used in the state in which, for example, the layers of the substrate 10 to the first compressive stress storage layer 301 are removed. There are cases where the semiconductor device 130 is used in the state in which a portion of the functional layer 70 is removed.

The semiconductor device 130 may be used in, for example, a gallium nitride (GaN) HEMT (High Electron Mobility Transistor) nitride semiconductor device. In such a case, the functional layer 70 has, for example, a stacked structure of an undoped $Al_{z1}Ga_{1-z1}N$ ($0 \le z1 \le 1$) layer that does not include an impurity and an undoped or n-type $Al_{z2}Ga_{1-z2}N$ ($0 \le z2 \le 1$ and $z1 < z2$) layer.

According to the fourth embodiment, the functional layer of the semiconductor device 130 is formed on the semiconductor wafer 120. The dislocation density of the semiconductor wafer 120 is reduced. Thereby, the operating characteristics of the semiconductor device 130 improve. In the case where the semiconductor device 130 is the semiconductor light emitting device, the luminous efficiency increases. In the case where the semiconductor device 130 is the electronic device, the carrier mobility or the response rate increases. The functional layer 70 of the semiconductor device 130 may be formed on the semiconductor wafer 110.

According to the embodiment recited above, a semiconductor wafer and a semiconductor device having low dislocation densities, and a method for manufacturing a nitride semiconductor layer can be provided.

In the embodiments, for example, metal-organic chemical vapor deposition (MOCVD), metal-organic vapor phase epitaxy (MOVPE), molecular beam epitaxy (MBE), hydride vapor phase epitaxy (HVPE), etc., may be used to grow the semiconductor layers.

For example, in the case where MOCVD or MOVPE is used, the following source materials may be used when forming the semiconductor layers. For example, TMGa (trimethylgallium) and TEGa (triethylgallium) may be used as the source material of Ga. For example, TMIn (trimethylindium), TEIn (triethylindium), etc., may be used as the source material of In. For example, TMAl (trimethylaluminum), etc., may be used as the source material of Al. For example, $NH_3$ (ammonia), MMHy (monomethylhydrazine), DMHy (dimethylhydrazine), etc., may be used as the source material of N. $SiH_4$ (monosilane), $Si_2H_6$ (disilane), etc., may be used as the source material of Si.

In the specification, "nitride semiconductor" includes all compositions of semiconductors of the chemical formula $B_xIn_yAl_zGa_{1-x-y-z}N$ ($0 \le x \le 1$, $0 \le y \le 1$, $0 \le z \le 1$, and $x+y+z \le 1$) for which the composition ratios x, y, and z are changed within the ranges respectively. "Nitride semiconductor" further includes group V elements other than N (nitrogen) in the chemical formula recited above, various elements added to control various properties such as the conductivity type and the like, and various elements included unintentionally.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, exemplary embodiments of the invention are described with reference to specific examples. However, the invention is not limited to these specific examples. One skilled in the art may similarly practice the invention by appropriately selecting specific configurations of components from known art; and such practice is included in the scope of the invention to the extent that similar effects are obtained.

Further, any two or more components of the specific examples may be combined within the extent of technical feasibility and are included in the scope of the invention to the extent that the purport of the invention is included.

Moreover, all semiconductor wafers, semiconductor devices, and methods for manufacturing a nitride semiconductor layer practicable by an appropriate design modification by one skilled in the art based on the semiconductor wafers, the semiconductor devices, and the methods for manufacturing the nitride semiconductor layer described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor wafer, comprising:
   a substrate having a first surface;
   an AlN buffer layer provided on the first surface of the substrate;
   a first layer provided on the AlN buffer layer, the first layer comprising a first nitride semiconductor comprising Al and Ga;
   a second layer provided on the first layer, the second layer comprising a second nitride semiconductor comprising Ga;
   a third layer provided on the second layer, the third layer comprising a third nitride semiconductor comprising Al and Ga, a Ga composition ratio in the third layer being lower than a Ga composition ratio in the second layer;
   a fourth layer provided directly on the third layer, the fourth layer comprising a fourth semiconductor comprising Al and Ga, a Ga composition ratio in the fourth layer being lower than the Ga composition ratio in the second layer, an Al composition ratio in the fourth layer being lower than an Al composition ratio in the third layer;
   an intermediate unit provided on the fourth layer, the intermediate unit comprising one element selected from the group consisting of Si, Mg, and B, a thickness of the intermediate unit being not less than a 0.2 atom layer and not more than 3 nanometers; and
   a fifth layer provided on the intermediate unit, the fifth layer having a composition same as a composition of the second layer,
   the fifth layer having a tensile strain, and
   the second layer having a compressive strain.

2. The semiconductor wafer according to claim 1, wherein a coefficient of thermal expansion of the substrate is less than a coefficient of thermal expansion of the second nitride semiconductor.

3. The semiconductor wafer according to claim 1, wherein the third layer receives a tensile strain, and
   the third layer has a first lattice spacing along a first axis parallel to the first surface,
   a difference between the first lattice spacing and a second lattice spacing is not less than 0.6% and not more than 1.4% of the second lattice spacing, the second lattice spacing is a lattice spacing of an unstrained nitride semiconductor having a composition same as a composition of the third layer.

4. The semiconductor wafer according to claim 1, wherein
a concentration of an impurity of at least one of an acceptor and a donor in the third layer is not more than $1\times10^{18}$ cm$^{-3}$, and
a concentration of an impurity of at least one of an acceptor and a donor in the fourth layer is not more than $1\times10^{18}$ cm$^{-3}$.

5. The semiconductor wafer according to claim 1, wherein a thickness of the intermediate unit is thinner than a thickness of the third layer.

6. The semiconductor wafer according to claim 1, wherein the intermediate unit is provided in an island configuration.

7. The semiconductor wafer according to claim 1, wherein the intermediate unit includes one selected from SiN, MgN, and BN.

8. The semiconductor wafer according to claim 1, wherein an Al composition ratio to group III elements in the fourth layer is not less than 0.2 and not more than 0.8.

9. The semiconductor wafer according to claim 1, wherein a thickness of the second layer is not less than 100 nanometers and not more than 5 micrometers.

10. The semiconductor wafer according to claim 1, wherein a thickness of the fifth layer is not less than 100 nanometers and not more than 5 micrometers.

11. The semiconductor wafer according to claim 1, wherein the substrate is one selected from a Si substrate, a SiC substrate, a GaP substrate, and an InP substrate.

12. The semiconductor wafer according to claim 1, wherein a dislocation density in the fifth layer is not more than $2\times10^{9}$/cm$^{2}$.

13. The semiconductor device according to claim 1, wherein the intermediate unit includes multiple openings.

14. A semiconductor device comprising:
a substrate having a first surface;
an AlN buffer layer of AlN, the AlN buffer layer being provided on the first surface of the substrate;
a first layer provided on the AlN buffer layer, the first layer comprising a first nitride semiconductor comprising Al and Ga;
a second layer provided on the first layer, the second layer comprising a second nitride semiconductor comprising Ga;
a third layer provided on the second layer, the third layer comprising a third nitride semiconductor comprising Al, a Ga composition ratio in the third layer being lower than a Ga composition ratio in the second layer;
a fourth layer provided directly on the third layer, the fourth layer comprising a fourth semiconductor comprising Al and Ga, a Ga composition ratio in the fourth layer being lower than the Ga composition ratio in the second layer, an Al composition ratio in the fourth layer being lower than an Al composition ratio in the third layer;
an intermediate unit provided on the fourth layer, the intermediate unit comprising one selected from Si, Mg, and B, a thickness of the intermediate unit being not less than a 0.2 atom layer and not more than 3 nanometers;
a fifth layer provided on the intermediate unit, the fifth layer having a composition same as a composition of the second layer; and
a functional layer provided on fifth layer,
the fifth layer having a tensile strain, and
the second layer having a compressive strain.

15. The semiconductor device according to claim 14, wherein a coefficient of thermal expansion of the substrate is less than a coefficient of thermal expansion of the fifth nitride semiconductor.

16. The semiconductor device according to claim 14, wherein the intermediate unit includes one selected from SiN, MgN, and BN.

* * * * *